United States Patent
Chan et al.

(10) Patent No.: US 6,895,566 B1
(45) Date of Patent: May 17, 2005

(54) METHODS AND APPARATUS FOR ISOLATING CRITICAL PATHS ON AN IC DEVICE HAVING A THERMAL ENERGY GENERATOR

(75) Inventors: Siuki Chan, Cupertino, CA (US); Steven H. C. Hsieh, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 175 days.

(21) Appl. No.: 10/300,203

(22) Filed: Nov. 19, 2002

(51) Int. Cl.[7] .............................................. G06F 17/50
(52) U.S. Cl. ................................ 716/4; 716/6; 716/16; 714/725; 714/726
(58) Field of Search ............................... 716/1, 2, 4, 5, 716/16–18; 714/745, 738, 733, 725, 39; 703/20; 365/201; 363/74; 358/437; 324/765, 158.1

(56) References Cited

U.S. PATENT DOCUMENTS

| | | | |
|---|---|---|---|
| 4,564,943 A | * | 1/1986 | Collins et al. ............... 714/745 |
| 5,325,209 A | * | 6/1994 | Manabe ....................... 358/437 |
| 5,689,411 A | * | 11/1997 | Chabraya ..................... 363/74 |
| 6,389,558 B1 | * | 5/2002 | Herrmann et al. ............ 714/39 |
| 6,546,513 B1 | * | 4/2003 | Wilcox et al. ............... 714/738 |
| 6,618,839 B1 | * | 9/2003 | Beardslee et al. ............. 716/4 |
| 6,634,014 B1 | * | 10/2003 | Lindberg et al. ............... 716/6 |
| 6,754,862 B1 | * | 6/2004 | Hoyer et al. ................. 714/725 |
| 2004/0025123 A1 | * | 2/2004 | Angillvelil ..................... 716/4 |

OTHER PUBLICATIONS

U.S. Appl. No. 10/310,494, Hsieh et al., filed Dec. 4, 2002.
XILINX, Inc., Virtex–II 1.5V Field–Programmable Gate Arrays, Nov. 29, 2001, pp. 1–39, DS031–2 (v1.9), Xilinx, Inc. 2100 Logic Drive, San Jose, CA., 95124.

* cited by examiner

Primary Examiner—Vuthe Siek
Assistant Examiner—Helen Rossoshek
(74) Attorney, Agent, or Firm—Arthur J. Behiel; Edel M. Young; Justin Liu

(57) ABSTRACT

Test methods and circuits isolate thermal effects from AC effects on circuit performance. Critical paths for a failing programmable logic device (PLD) are identified and tested. This testing minimizes the impact of power-supply flicker and noise by eliminating or inactivating circuitry not required to test the critical paths. DC thermal energy generators are instantiated on the PLD adjacent the critical paths to heat the critical paths to one or more test temperatures. The critical paths are then tested over an appropriate range of temperatures and supply-voltages.

17 Claims, 3 Drawing Sheets

METHODS AND APPARATUS FOR ISOLATING CRITICAL PATHS ON AN IC DEVICE HAVING A THERMAL ENERGY GENERATOR

FIELD OF THE INVENTION

The invention relates to methods and circuits for thermally conditioning integrated circuits for testing.

BACKGROUND

Operating temperature and power-supply voltage affect both the life and the speed performance of integrated circuits (ICs). Elevated operating temperatures can lead to premature failure or reduced performance, for instance, degrading frequency response or increasing distortion. Unstable power-supply voltages can also lead to premature failure and reduced performance.

IC manufacturers thoroughly test their ICs prior to sale to guarantee functionality and dynamic performance under given temperature and power-supply specifications. Only ICs that pass such rigorous tests are sold to Original Equipment Manufacturers (OEMs). OEMs then include these ICs in more complex systems, which typically include collections of ICs on printed circuit boards (PCBs).

Systems that perform a particular function (e.g., signal processing) typically include different kinds of ICs mounted on one or more PCBs. Power-supply and thermal-management schemes are used during PCB layout to ensure that thermal, power and supply-voltage requirements are met for each IC.

High performance systems (e.g., telecommunication systems) built on densely populated PCBs are highly susceptible to excessive noise and overheating. The noise problem is due in part to electromagnetic coupling between closely spaced, high-speed ICs operating at different speeds and supply voltages. Ineffective or failed power-supply management schemes can exacerbate these problems—or at least fail to effectively address them—leading to power-supply problems commonly referred to as "power flickering" or "flicker effects." Depending on its magnitude, power flickering can cause one or more ICs to fail to meet their timing or functional specifications. Similarly, a failed or ineffective thermal management scheme can cause one or more ICs to fail.

Should an OEM's system fail, the OEM may trace the failure to a manufacturer's IC and solicit the manufacturer's help in evaluating the IC and pinpointing the failure mechanism. Determining whether a performance failure is due to power flickering or excessive heat can be very challenging because active circuits in a device under test (DUT) produce both flicker and heat. For example, substantial AC activity on a DUT generates heat as current is periodically drawn from power supplies, and the periodic drawing of current produces flicker effects. Thus, to determine the cause of a performance failure, there exists a need for a means of decoupling the effects of temperature and flicker.

SUMMARY

The present invention addresses the need for a means of decoupling temperature and flicker effects in an IC's performance failure analysis. In one embodiment, one or more critical paths are identified in a design expression for a failing programmable logic device (PLD). The critical paths are then used to develop a test expression for analyzing the critical paths. The test expression omits or renders inactive much of the circuitry in the failing design to eliminate any effects such circuitry might have on the critical paths. In addition to the critical paths, the test expression defines some test circuitry required to exercise the critical paths and one or more thermal energy generators, or "heaters."

To test the critical paths, the test expression is used to instantiate a test circuit on a PLD. The test circuit includes the critical paths, the circuitry required to exercise the critical paths, and the heaters. The heaters are then activated to heat the PLD to a target temperature. The critical path is exercised at that temperature and at various power-supply voltages to determine whether the critical paths function over the appropriate ranges of temperature and supply voltage. Flicker effects are minimized because most of the design expression is missing or inactive during testing.

If the signal path passes performance at all test temperatures and supply voltages, then the failure is likely due to an OEM's system PCB thermal-management or power-supply management issues. If, however, the signal path fails performance across the range of test temperatures and supply-voltages (i.e., the IC fails to meet the manufacturer's specification for the given design), then the failure is likely due to a faulty IC, or ineffective mapping software that implements the design expression on the IC.

The allowed claims, and not this summary, define the scope of the invention.

DETAILED DESCRIPTION

Figure 1:
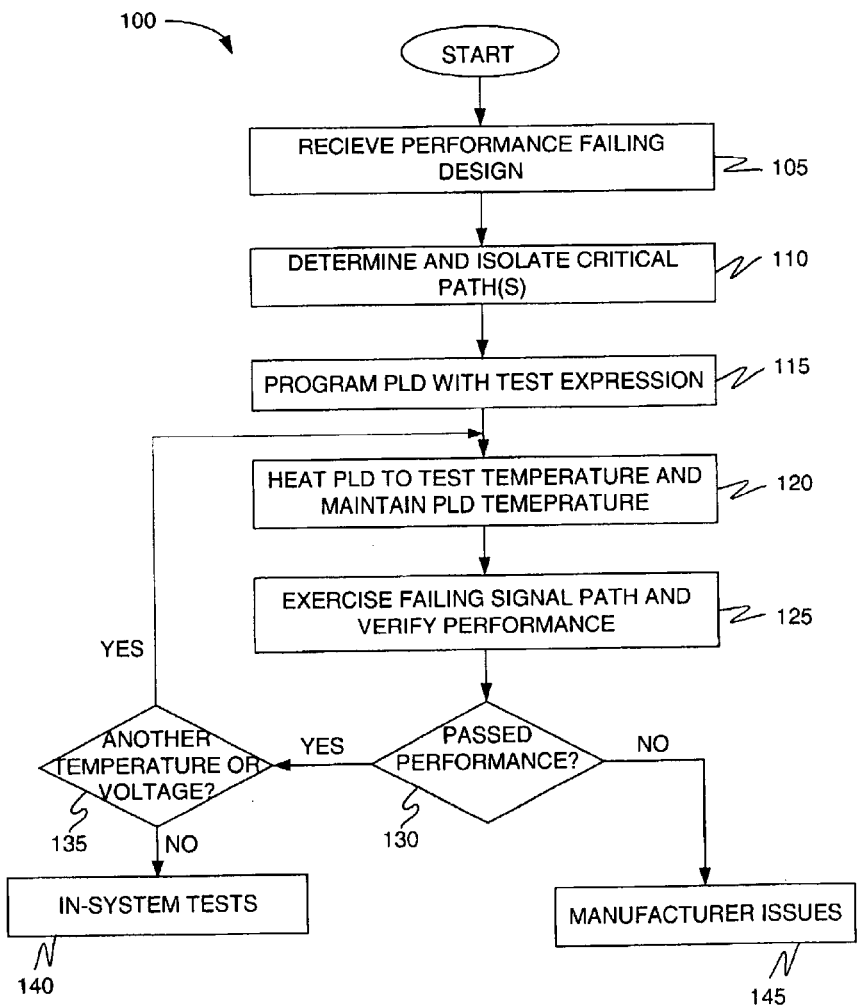
FIG. 1 is a flow chart 100 showing one embodiment of the present invention as applied to a PLD.

FIG. 1 is a flow chart 100 illustrating a PLD test method in accordance with an embodiment of the invention. A PLD manufacturer receives a design expression from an OEM experiencing a problem with a PLD programmed with the design expression (step 105). Assuming that the problem is not due to a faulty PLD, the manufacturer then analyzes the design to identify the critical signal path or paths (step 110).

A number of conventional tools are available to identify critical timing paths from the design expression. Examples include those incorporated into the ISE suite of design tools available from Xilinx, Inc., of San Jose, Calif. Critical paths typically extend between commonly clocked sequential storage elements (e.g., registers or flip-flops) so that data traversing the critical path must reach the subsequent storage element between clock edges. Signal paths having inherent delays closest to the clock period are deemed "critical paths" because these slowest paths determine the maximum clock rate of a system. Critical paths are also a likely source of errors. The failure analysis performed in accordance with one embodiment of the invention focuses on critical timing paths. The following discussion assumes just one critical path, for brevity, but a typical design of interest may include many critical paths.

The portion of the failing design expression defining the critical path is extracted from the design expression and incorporated into a test expression. The test expression defines (1) a test circuit designed to exercise the critical path to determine whether the critical path functions properly, at speed, within the accepted voltage and temperature ranges for the DUT; and (2) one or more thermal energy generators.

Figure 2:
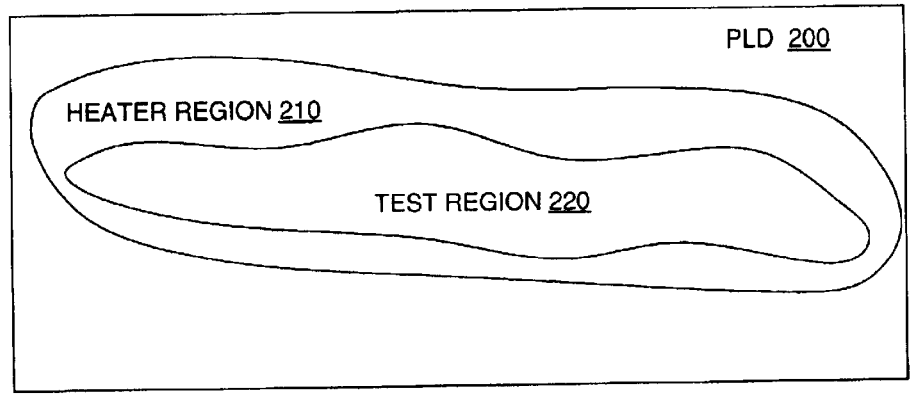
FIG. 2 is a block diagram of a PLD with a failing path region completely enclosed by thermal energy generators.

FIG. 2 depicts a block diagram of a programmable logic device (PLD) 200 configured in accordance with one embodiment of the invention. PLD 200 is preferably of the same type as the PLD that failed on an OEM PCB when programmed with a failing design expression. PLD 200 is configured with the test expression (step 115 on FIG. 1), and consequently includes a collection of heaters occupying a first region 210 surrounding a test circuit occupying a second region 220. Surrounding region 220 with DC heaters allows region 220 to be quickly and uniformly heated to a test temperature before exercising the test circuit. Input and output resources (not shown) on PLD 200 can be used to provide external test signals to the critical path, and to monitor the critical-path output.

Returning to FIG. 1, the PLD is powered up and the DC heaters given time to heat the PLD to a test temperature (step 120). While the PLD is held at the test temperature, the test circuit is exercised (step 125) and monitored for performance.

At decision 130, if the critical path fails to operate within the voltage and temperature ranges specified as appropriate by the PLD manufacturer, then the failure is likely due to a problem with the PLD. For example, the PLD may be defective, the software used to map the design expression into the PLD may have a problem, or the models upon which the critical-path delay is based may be erroneous. In such cases, the manufacturer subjects the PLD to further tests to identify and solve the problem (step 145).

If the critical path passes performance at a particular temperature, then steps 120 and 125 may be repeated at additional test temperatures and at various supply voltages to ensure the critical path functions properly throughout the specified voltage and temperature ranges (step 135). In one embodiment, the test temperature is varied by instantiating or activating more or fewer DC heaters.

If the critical path passes performance across the range of test temperatures and supply voltages, then any remaining critical paths can be tested in the manner described above. Should all critical paths pass, then the problem may be caused by circumstances unique to the OEM application, such as thermal and power-supply management on the PCB or interference from adjacent circuits in the OEM design. The IC manufacturer might therefore collect empirical data from the PLD in the OEM system environment. For example, the package temperature and supply-voltage levels might be monitored in situ to determine whether the PLD is adequately powered and cooled (step 140).

Conventional thermal testing requires a special thermal test IC, which generates heat when voltage is applied to its internal resistance. The thermal test IC is used to generate and apply heat to an IC package under test. This can be awkward or impractical in many circumstances, since the thermal test IC is different from the IC that will be used in the actual system. Instantiating heaters directly on the IC under test, however, eliminates the need for the thermal test IC (or any other external heat sources), and thus simplifies thermal testing in many cases. Using these methods, ICs can even undergo remote thermal testing. For example, a PLD mounted on a remote PCB can be programmed with a test expression via a conventional JTAG test port. DC heaters are generally preferred to circuits that generate heat by switching current (e.g., fast-running ring oscillators) because such circuits may introduce undesirable AC noise on the power supply lines.

Figure 3:
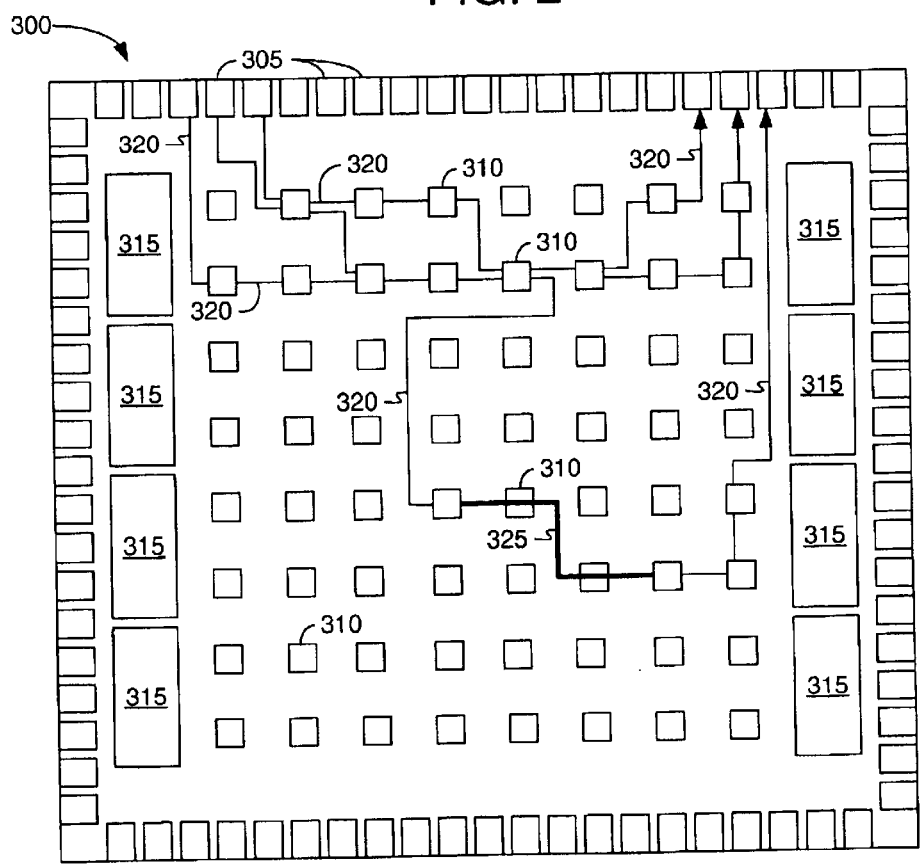
FIG. 3 is a block diagram of a conventional FPGA 300 in which is instantiated an illustrative OEM design.

FIG. 3 (prior art) is a block diagram of a conventional FPGA 300 in which is instantiated a simple, illustrative OEM circuit design. FPGA 300 conventionally includes a collection of programmable logic, including a plurality of input/output blocks (IOBs) 305, an array of configurable logic blocks (CLBs) 310, and a plurality of RAM blocks 315, all of which may be selectively interconnected via programmable routing resources.

IOBs 305 provide circuitry for communicating signals with external devices; CLBs 310 are the primary building blocks and contain elements for implementing customizable gates, flip-flops, and wiring; and RAM blocks 315 allow for synchronous or asynchronous data storage, though each CLB can also implement synchronous or asynchronous RAMs. The programmable routing resources interconnect the various elements, forming a plurality of signal nets 320 in the example. The depicted OEM design is just an arbitrary collection of nets 320 made up of programmable interconnect resources and extending among and through CLBs 310. Actual designs are unnecessarily complex for the present discussion. For a detailed treatment of one FPGA, see the Xilinx advance product specification entitled "Virtex-II 1.5V Field-Programmable Gate Arrays," DS031-2 (v1.9), Nov. 29, 2001, which is incorporated herein by reference.

One net, highlighted as a bold line, represents a critical path 325 of the depicted design. As noted above, a critical path typically extends between commonly clocked sequential storage elements (e.g., registers or flip-flops) so that data traversing the critical path must reach the subsequent storage element between clock edges.

Figure 4:
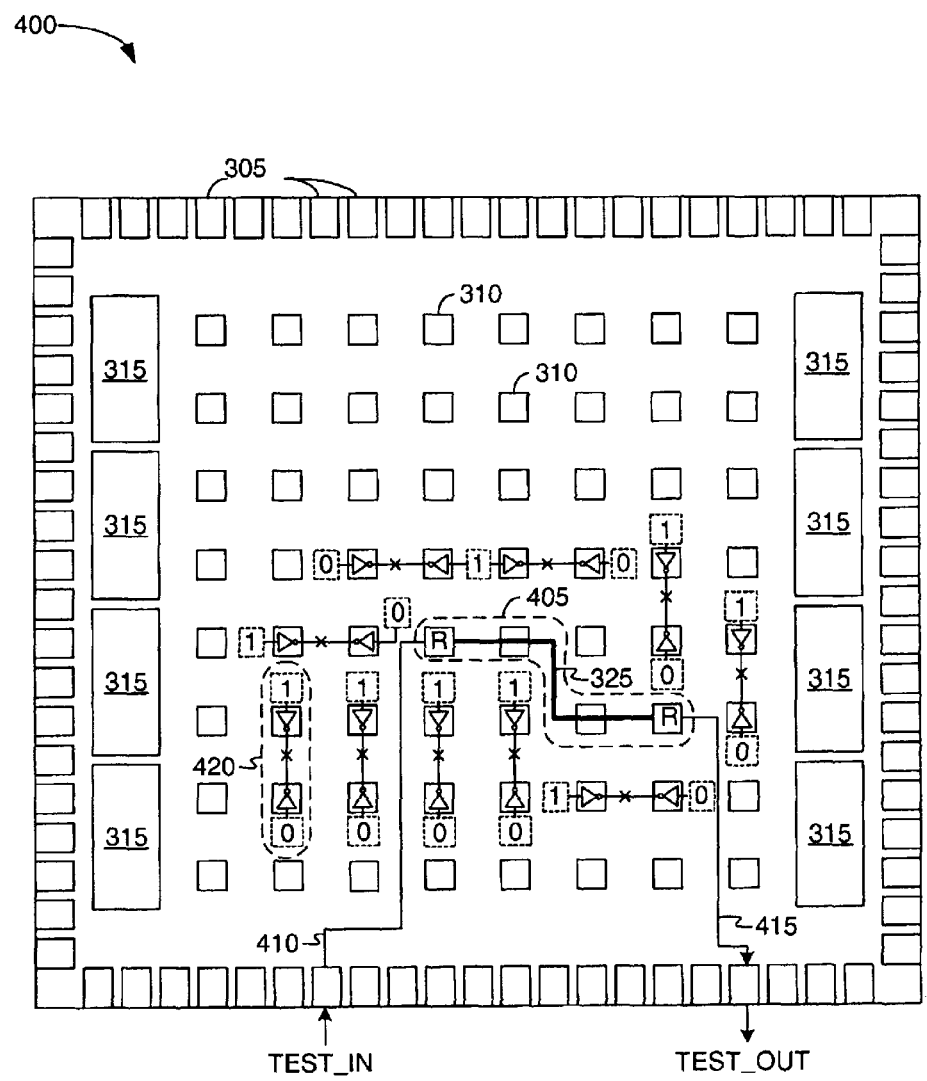
FIG. 4 depicts an FPGA 400 configured with a critical path and thermal energy generators.

FIG. 4 depicts an FPGA 400 of the type depicted in FIG. 3 but configured, using a test expression, to include a test circuit for testing the performance of critical path 325. FPGA 400 is physically identical to FPGA 300 of FIG. 3, like-named elements being the same.

The test expression used to program FPGA 400 defines a test circuit 405, which includes critical path 325 extending between an input node connected to the left-most register R and an output node connected to the right-most register R. Respective input and output lines 410 and 415 enable a conventional external tester (not shown) to send and receive test vectors to and from test circuit 405. The test expression additionally defines a collection of thermal-energy generators (heaters), one labeled 420, adapted to heat the area surrounding test circuit 405. Heaters 420 can be distributed over the surface of FPGA 400 to provide relatively even heating, or can be concentrated in one or more regions, as desired.

In the depicted embodiment, each heater 420 includes a pair of CLBs with their respective output terminals connected in contention. The contention is depicted as pairs of inverters with their respective input terminals tied to different logic levels. CLBs 310 are typically CMOS circuits, so contention defines a signal path through a forward-biased PMOS transistor, a path of programmable interconnect, and a forward-biased NMOS transistor. The steady current created by the contention generates heat without inducing significant levels of noise.

Once configured as shown, FPGA 400 is powered and heaters 420 are activated. Heaters 420 heat region 420 to the test temperature, which is monitored using any of a number of conventional methods. For example, FPGA 400 might include a conventional temperature sensitive diode for which there exists a known relationship between forward voltage and temperature, or PLD package temperature can be measured and related to PLD die temperature using an empirically derived thermal resistance value of the package.

Once FPGA 400 reaches an appropriate test temperature, the conventional tester provides one or more test vectors on line 410 to the input register R of test circuit 405. The tester clocks registers R at an appropriate test frequency to ensure test circuit 405 functions at speed. Alternatively, circuitry programmed or included in FPGA 400 could be used to generate the test vectors and/or clock registers R. The tester then monitors the resulting output signal from line 415 to ensure that test vectors traversed critical path 325 without error. The test can be repeated at any number of combinations of supply voltage and operating temperature to ensure critical path 325 functions properly across appropriate ranges of temperatures and voltages.

While the present invention has been described in connection with specific embodiments, variations of these embodiments will be obvious to those of ordinary skill in the art. For example, the invention is not limited to FPGAs of the type discussed above; in general, high-density PLD architectures include a number of programmable logic elements and some programmable routing resources. Programmable logic elements have many forms and many names, such as CLBs, logic blocks, logic array blocks, macrocells, logic cells, and functional blocks. Programmable routing resources also have many forms and many names. Furthermore, application of the invention is not limited to PLDs, but may be used in non-programmable logic ICs, as where one or more DC heaters are included in the design of an IC or IC package. Finally, test signals need not be generated and analyzed off chip; instead, either or both of test-signal generation and analysis can be accomplished on chip. Therefore, the spirit and scope of the appended claims should not be limited to the foregoing description.

What is claimed is:

1. A method for separating temperature effects from flicker effects on a design expression adapted for instantiation on a programmable logic device, wherein the programmable logic device includes programmable logic elements and programmable interconnect lines, the method comprising:
   programming the programmable logic device to include a test expression, wherein programming the programmable logic device to include the test expression comprises:
   a. programming the programmable logic device to include a critical path in a first region of the programmable logic device; and
   b. programming the programmable logic device to include at least one thermal energy generator in a second region of the programmable logic device.

2. The method of claim 1, further comprising applying power to the at least one thermal energy generator to heat the programmable logic device and testing the performance of the critical path.

3. The method of claim 1, wherein the programming of steps a and b are accomplished in a single programming sequence.

4. The method of claim 1, wherein the at least one thermal energy generator is a DC heater.

5. The method of claim 1, wherein programming the programmable logic device to include the at least one thermal energy generator comprises:
   a. programming a first of the programmable logic elements to provide a first output signal of a first logic level on a first output terminal;
   b. programming a second of the programmable logic elements to provide a second output signal of a second logic level on a second output terminal; and
   c. programming the interconnect lines to connect the first and second output terminals.

6. The method of claim 1, further comprising:
   a. receiving a performance failing design expression;
   b. analyzing the performance failing design expression to identify the critical path; and
   c. generating the test expression, wherein a critical path is associated with the test expression.

7. The method of claim 6, wherein the at least one thermal energy generator is associated with the test expression.

8. The method of claim 6, wherein the critical path includes an input node and an output node, the method further comprising sending a test vector from the input node to the output node.

9. The method of claim 8, further comprising monitoring the output node.

10. The method of claim 1, wherein the programmable logic device is heated to a test temperature.

11. The method of claim 10, wherein the test temperature is an operating temperature at which the design expression fails performance when instantiated on the programmable logic device.

12. A test circuit for exercising a signal path on a programmable logic device, the test circuit comprising:
   a. a test input node connected to a first end of the signal path;
   b. a test output node connected to a second end of the signal path;
   c. a tester having a tester output node connected to the test input node and a tester input node connected to the test output node, wherein the tester is adapted to provide a test vector to the test input node and monitor the test output node; and
   d. at least one thermal energy generator instantiated on the programmable logic device, wherein activating the at least one thermal energy generator heats the signal path.

13. The test circuit of claim 12, wherein the programmable logic device includes a plurality of programmable logic elements and programmable interconnect resources, and wherein the thermal energy generator includes at least one pair of the logic elements connected in contention via some of the programmable interconnect resources.

14. The test circuit of claim 12, wherein the at least one thermal energy generator is a DC heater.

15. An integrated circuit comprising:
   a. a signal path having a signal-path input node and a signal-path output node, the signal-path input node receiving a test signal; and
   b. at least one thermal energy generator heating the signal path; and wherein the integrated circuit comprises programmable logic resources; and wherein the at least one thermal energy generator is instantiated in the programmable logic resources.

16. The integrated circuit of claim 15, wherein the programmable logic resources are configured in contention to form the at least one thermal energy generator.

17. The integrated circuit of claim 15, wherein the at least one thermal energy generator is a DC heater.

* * * * *